United States Patent [19]
Hong

[11] Patent Number: 5,496,747
[45] Date of Patent: Mar. 5, 1996

[54] SPLIT-GATE PROCESS FOR NON-VOLATILE MEMORY

[75] Inventor: Gary Hong, Hsin-chu, Taiwan

[73] Assignee: United Microelectronics Corporation, Hsinchu, Taiwan

[21] Appl. No.: 100,422

[22] Filed: Aug. 2, 1993

[51] Int. Cl.$^6$ .............................................. H01L 21/8247
[52] U.S. Cl. ................... 437/35; 437/43; 437/191
[58] Field of Search .................... 437/35, 43, 44, 437/191

[56] References Cited

U.S. PATENT DOCUMENTS

| 4,639,893 | 1/1987 | Eitan | 365/185 |
|---|---|---|---|
| 4,771,012 | 9/1988 | Yabu et al. | 437/29 |
| 5,063,172 | 11/1991 | Manley | 437/43 |
| 5,073,514 | 12/1991 | Ito et al. | 437/44 |
| 5,147,811 | 9/1992 | Sakagami | 437/35 |
| 5,158,901 | 10/1992 | Kosa et al. | 437/40 |
| 5,316,961 | 5/1994 | Okazawa | 437/43 |
| 5,413,946 | 5/1995 | Hong | 437/43 |

FOREIGN PATENT DOCUMENTS 2-211638  8/1990  Japan ........................... 437/35

OTHER PUBLICATIONS

"¼ μm Latid (Large–Tilted–Angle Implanted Drain) Technology" by T. Hori published in IEDM 1989, pp. 777–780.
"Graded–Junction Gate/N–Overlapped LDD MOSFET Structures for High Hot–Carrier Reliablity" by Y. Okumura et al, published in IEEE Transactions on Electron Devices, vol. 38, No. 12, Dec. 1991 (pp. 2647–2656).

Primary Examiner—Chandra Chaudhari
Attorney, Agent, or Firm—George O. Saile; Jerry Jones

[57] ABSTRACT

A split-gate memory cell and its fabrication are described. The semiconductor substrate is of a first conductivity type. The process begins by forming a conductive gate overlying the substrate, but electrically insulated therefrom by a layer of a first dielectric material. The gate comprises a first layer of conductive material, a second layer of dielectric material, and a third layer also composed of a second conductive layer. First and second sidewall dielectric spacers are formed adjacent to the first edge and the second opposing edge, respectively of the gate. Ions are implanted into the substrate. Those ions comprise a species of an opposite conductivity type. The ions are implanted at a substantial acute angle relative to a vertical angle with respect to the substrate. A third conductive material is deposited upon the second conductive layer and the first and second sidewall dielectric spacers. The third conductive material is in electrical contact with the second conductive layer.

16 Claims, 2 Drawing Sheets

SPLIT-GATE PROCESS FOR NON-VOLATILE MEMORY

BACKGROUND OF THE INVENTION

1. Field of the Invention

This invention relates to semiconductors and more particularly to split-gate MOSFET devices such as flash memories.

2. Description of Related Art

There are several known ways of making split-gate structures which require critical alignment masking steps with all the known problems attendant therewith such as misalignment during the masking step, or etching of one side of a (polysilicon (poly)) spacer.

U.S. Pat. No. 4,639,893 of Eitan for "Self-Aligned Split Gate EPROM" shows photoresist on one side of a floating polysilicon 1 gate. The total channel length of a split-gate manufactured in this manner depends upon the alignment of the photoresist mask on a polysilicon 1 gate.

U.S. Pat. No. 5,063,172 of Manley for "Manufacture of a Split Gate EPROM Cell Using Polysilicon Spacers" shows a split-gate structure with a conductive polysilicon spacer. Ion implantation is performed after photoresist has been used to etch away the spacer on the source side.

There is a technology called large tilted angle ion implantation which allows ion implantation to be preformed at angles other than the vertical, that is 0°. This technique has been used to make various MOSFET LDD integrated circuit devices. The U.S. Pat. No. 4,771,012 to Yabu et al; U.S. Pat. No. 5,073,514 to Ito et al; U.S. Pat. No. 5,158,901 to Koss et al and U.S. Pat. No. 5,147,811 all show the sue of tilted angle ion implantation to make integrated circuit devices. The publication "¼ µm LATID (LArge-Tilted-angle Implanted Drain) TECHNOLOGY" by T. Hori, published in IEDM 89 pages 777/780 and "Graded-Junction Gage/N-Overlapped LDD MOSFET Structures for High Hot-Carrier Reliability" by U. Okumura et al published in the IEEE Transactions on Electron Devices, Vol. 38, No. 12, Dec. 1991 (pages 2647–2656) show further use of tilted angle ion implantation. These references all use single tilted angle ion implantation to improved device performance.

An object of this invention is a process which avoids any critical masking steps needed to fabricate a split-gate, non-volatile memory.

In accordance with this invention a semiconductor is formed using a Large-Angle-Implant (LAI) process to generate an off-set region for split-gate formation.

SUMMARY OF THE INVENTION

In accordance with this invention, a split-gate memory cell and its method of fabrication are provided. The semiconductor substrate is of a first conductivity type. The device is made by forming a conductive gate overlying the substrate, but electrically insulated therefrom by a layer of a first dielectric material. The gate comprises a layer of a first conductive material, a second layer of dielectric material, and a third layer of a second conductive material. First and second sidewall dielectric spacers are formed adjacent to the first edge and the second opposing edge, respectively of the gate. Ions are implanted into the substrate of a species of an opposite conductivity type, at a substantial acute angle relative to a vertical angle with respect to the substrate. A third conductive material is deposited upon the second conductive layer and the first and second sidewall dielectric spacers. The third conductive material is in electrical contact with the second conductive layer.

Preferably, the second layer of dielectric material comprises ONO; the second and third conductive layers consist essentially of doped polysilicon, the acute angle is a selected angle between about 20 and 45 degrees, and the substrate is held in fixed position rotationally during the ion implantation process.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
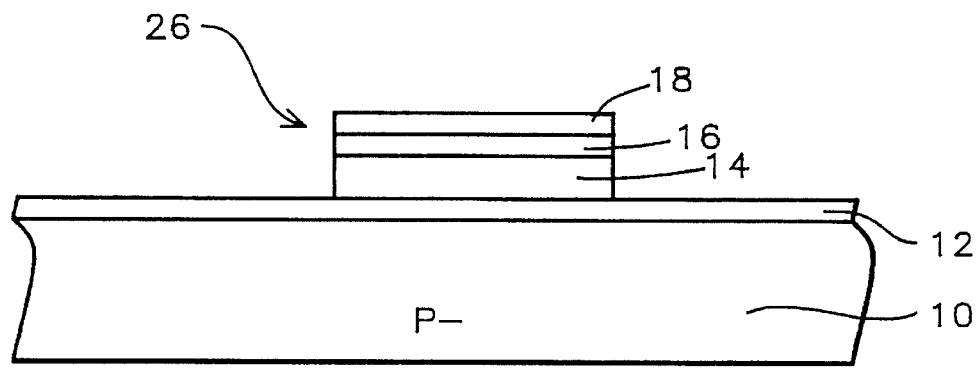
FIG. 1. shows a P-sub silicon semiconductor substrate carrying, a thin layer of gate oxide structure, carrying a layer of conductive material forming the lower portion of a split-gate 26, coated with an interconductor (interpoly) dielectric layer composed preferably of Oxide Nitride Oxide (ONO). Finally a layer of polysilicon forms the upper portion of the split-gate.

FIG. 1. shows a semiconductor substrate 10 composed of silicon lightly doped with boron converting substrate 10 into a P– sub 10. A thin layer of gate oxide 12 is deposited upon the substrate 10. The oxide has a thickness of between about 60 Å and about 200 Å. A silicon oxide thickness of below about 150 Å, is preferred for use in flash memory devices. The oxide is deposited by a conventional thermal oxidation process (similar to that used for gate oxide growth.)

Next a layer 14 composed preferably of polysilicon 1 (poly 1) forming the lower portion of a split-gate 26 is deposited having a thickness of 500 Å–2000 Å. The polysilicon 1 layer 14 is formed on top of gate oxide layer 12. Layer 14 comprises a heavily doped layer of polysilicon formed by thermal decomposition of silane ($SiH_4$) in a reactor at a temperature between about 600° C. and about 650° C. at a pressure of between about 0.2 Torr and about 1.0 Torr using 100% silane or a diluted mixture of between about 20% and about 30% silane in nitrogen at about the same pressure, as described in Sze, "VLSI Technology", McGraw Hill Book Co., pages 238–239 (1988).

Next an interconductor dielectric layer 16 composed preferably of Oxide Nitride Oxide (ONO) or another suitable interpoly dielectric is deposited. In the case of ONO, the bottom layer of oxide is deposited by thermal oxidation or CVD to a thickness of between about 50 Å and about 100 Å, the nitride is deposited by a conventional LPCVD silicon nitride deposition process to a thickness of between about 80 Å and about 180 Å and the upper oxide is deposited by thermal oxidation or CVD to a thickness of between about 30 Å and about 80 Å.

A layer 18 of polysilicon (poly 2), having a thickness of between about 200 Å and about 2000 Å, forms the upper portion of split-gate 26. The polysilicon layer 18 is formed on top of dielectric layer 16. Layer 18 comprises a heavily doped layer of polysilicon formed by conventional LPCVD deposition of polysilicon.

Figure 2:
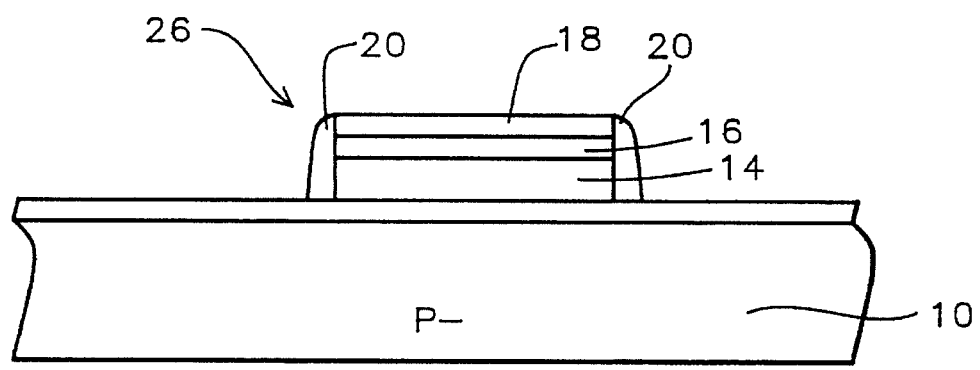
FIG. 2 shows the product of FIG. 1 first and second sidewall dielectric, after spacers have been formed on a portion of the gate oxide. The spacers are juxtaposed adjacent to the first edge and the second opposing edge, respectively of the split-gate.

In FIG. 2 spacers 20 have been formed on the product of FIG. 1. First and second sidewall dielectric spacers 20 are juxtaposed adjacent to the first edge and the second opposing edge, respectively of the split-gate 26. The spacers 20 are formed by CVD deposition of $SiO_2$. The $SiO_2$ is deposited to a thickness of between about 1000 Å and about 3000 Å in a conventional manner. Next that $SiO_2$ is etched and the interconductor dielectric layer 16 is protected by top layer 18 of polysilicon 2 during the etching of the oxide to form spacers 20.

Figure 3:
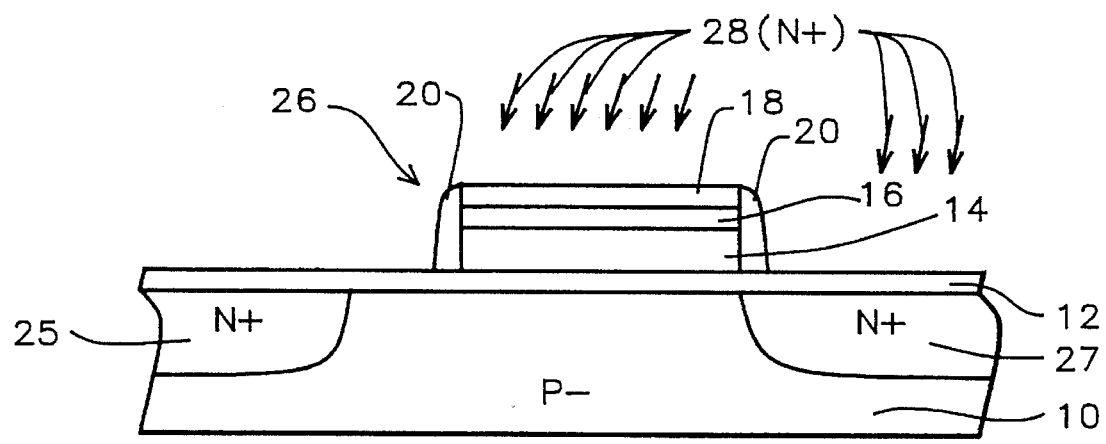
In FIG. 3, the product of FIG. 2 is shown illustrating how source and drain ion implantation is performed with N+ dopant ions being applied using the process of Large-Angle-Implant (LAI) to generate an off-set in Source/Drain regions in the substrate of the split-gate device of FIG. 2.

In FIG. 3, the product of FIG. 2 is shown illustrating how source and drain ion implantation is performed with N+ dopant ions 28 being applied using the process of Large-Angle-Implant (LAI) to generate an off-set in Source/Drain regions 25, 27 in the substrate 10 of the split-gate device. Next N+ dopant ions are implanted into the source region 25 and the drain region 27. Source region 27 is offset from the gate 26 by the LAI angle. The chemical species of the dopant implanted is arsenic (As) with a dose of between about 1 and $8\times10^{15}$ cm$^{-2}$, an energy of 50–100 keV in a high current LAI implanter.

Figure 4:
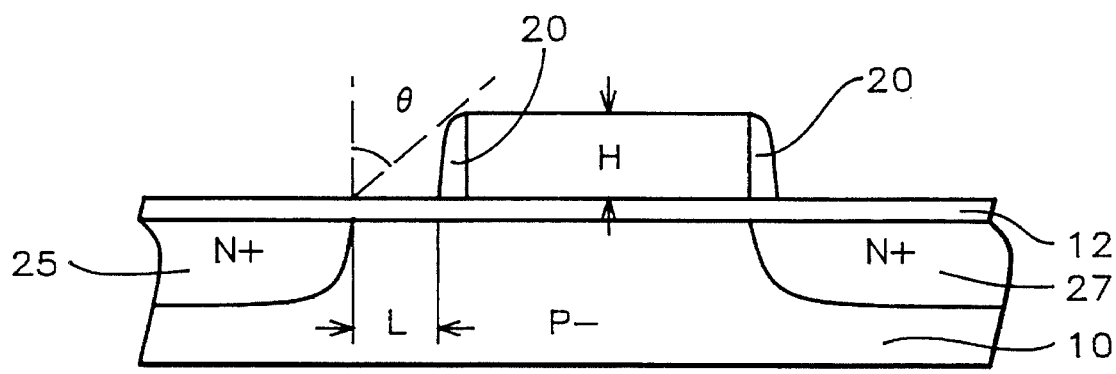
FIG. 4 is a schematic diagram of the dimensions of the profile of a split-gate memory transistor.

FIG. 4 is a schematic diagram of the dimensions of the profile of a split-gate memory transistor. The height of the split-gate is "H." A distance "L" extends from the periphery of the spacer 20 to the source region 25. A line drawn from from the inner border of the source region 25 to the nearest edge of the top edge of spacer 20 forms a line at the angle θ. The relationship between the parameters defined above is stated by equation (1) as follows:

$$L = H \times \tan\theta \quad (1)$$

$$L = 0.3 \ \mu m \approx 0.7 \ \mu m \quad (2)$$

$$L = 3000 \ \text{Å} \approx 7000 \ \text{Å}$$

It is desired that L be kept to a minimum length because the cell will decrease as L is increased. However L must have a minimum length for the transistor to be effective as an isolation transistor. The fundamental purpose of the split-gate is to prevent the flash cell from leakage when the cell is "overerased."

In the practical application illustrated by FIG. 1, the thicknesses of the layers of the split-gate are as follows:

| | |
|---|---|
| polysilicon 2 (layer 18) | 200 Å–2000 Å |
| ONO (layer 16) | 150 Å–350 Å |
| polysilicon 1 (layer 14) | 500 Å–2000 Å |
| TOTALS | 850 Å–4350 Å |

Applying the above data to equation (1) and taking the example of a typical height H of about 4000 Å and an angle θ of 45°, tan θ=1, so $$L = H \times \tan\theta = 4000 \ \text{Å} \times 1 = 4000 \ \text{Å} = 0.4 \ \mu m \quad (3)$$

Thus, in this example, the value of L is about 4000 Å. One can adjust H and/or θ to get a desired value of L to optimize the value of L with minimal leakage.

Manifestly, to achieve the desired result, it is required that the wafer and wafer holder be retained in fixed angular position without rotation during the LAI process. The interpoly dielectric layer 16 is protected by the polysilicon 2 layer 18 during the LAI.

Figure 5:
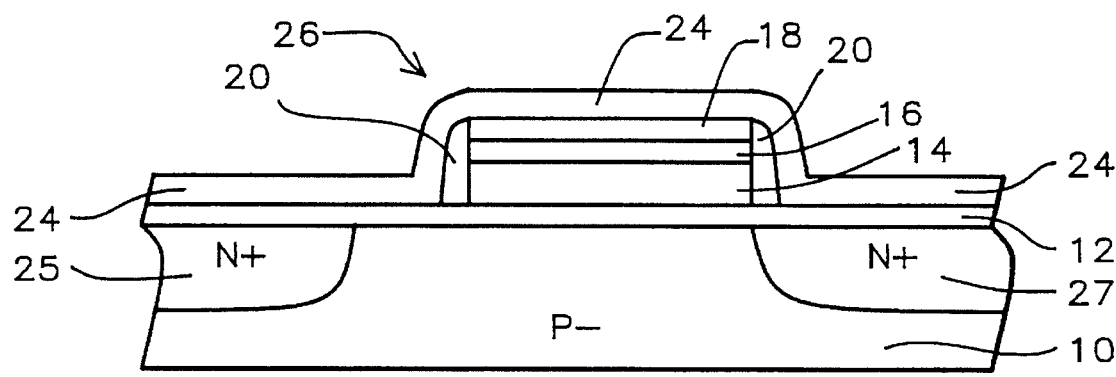
Referring to FIG. 5, the product of FIG. 3 is shown after a conductor layer comprising a third conductive material, preferably a third polysilicon layer (poly 3), has been deposited upon the second conductive layer and the first and second sidewall dielectric spacers.

Referring to FIG. 5, the product of FIG. 3 is shown after a conductor layer 24 comprising a third conductive material, preferably a third polysilicon layer (poly 3), has been deposited upon the second conductive layer 18 and the first and second sidewall dielectric spacers 20. The third conductive material (layer 24) is in electrical contact with the second conductive layer 18. The polysilicon 3 layer has been applied by the same process as the previous layers of polysilicon, polysilicon 1 and polysilicon 2. Layer 24 comprises a heavily doped layer of polysilicon formed in the same way as polysilicon 1. Polysilicon 3 can instead be polycide to lower the word line resistance because polysilicon 3 will be the word line (control gate.) polycide to lower the word line resistance because polysilicon 3 will be the word line (control gate.)

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a split-gate memory cell on a semiconductor substrate of a first conductivity type, comprising the steps of:

forming a conductive gate overlying said substrate but electrically insulated therefrom by a layer of a first dielectric material, said gate comprising a first conductive layer of material thereon, a second layer of dielectric material formed thereon, and a second conductive layer of material deposited thereon, forming first and second sidewall dielectric spacers adjacent to the first edge and the second opposing edge, respectively of said gate, ion implantation into said substrate of a species of an opposite conductivity type, using a large angle implant, and a third conductive layer of material deposited upon said second conductive layer and said first and second sidewall dielectric spacers, said third conductive material being in electrical contact with said second conductive layer.

2. A method in accordance with claim 1 wherein said second layer of dielectric material comprises ONO.

3. A method in accordance with claim 1 wherein said second conductive layer consists essentially of doped polysilicon and said third conductive layer consists of a material selected from doped polysilicon and a polycide structure.

4. A method in accordance with claim 1 wherein said angle is a selected angle between about 20 and 45 degrees.

5. A method in accordance with claim 2 wherein said angle is a selected angle between about 20 and 45 degrees.

6. A method in accordance with claim 3 wherein said angle is a selected angle between about 20 and 45 degrees.

7. A method in accordance with claim 1 wherein said substrate is held in fixed position rotationally during said ion implantation process.

8. A method in accordance with claim 2 wherein said substrate is held in fixed position rotationally during said ion implantation process.

9. A method in accordance with claim 3 wherein said substrate is held in fixed position rotationally during said ion implantation process.

10. A method in accordance with claim 4 wherein said substrate is held in fixed position rotationally during said ion implantation process.

11. A method in accordance with claim 5 wherein said substrate is held in fixed position rotationally during said ion implantation process.

12. A method in accordance with claim 6 wherein said substrate is held in fixed position rotationally during said ion implantation process.

13. A method in accordance with claim 1 wherein said second layer of dielectric material comprises a bottom layer of oxide, a middle layer of nitride and a top layer of oxide wherein said bottom layer of oxide is deposited by thermal oxidation or CVD to a thickness of between about 50 Å and about 100 Å, said nitride is deposited by a LPCVD silicon nitride deposition process to a thickness of between about 80 Å and about 180 Å and said top layer of oxide is deposited by thermal oxidation or CVD to a thickness of between about 30 Å and about 80 Å.

14. A method in accordance with claim 1 wherein said said first conductive layer comprises a heavily doped layer of polysilicon having a thickness of between about 500 Å and about 2000 Å, formed by thermal decomposition of silane $SiH_4$ in a reactor at a temperature between about 600° C. and about 650° C. at a pressure of between about 0.2 Torr and about 1.0 Torr using 100% silane or a diluted mixture of between about 20% and about 30% silane in nitrogen, said second conductive layer consists essentially of doped polysilicon having a thickness of between about 200 Å and about 2000 Å forming the second conductive layer of said split-gate, said second conductive layer comprising a heavily doped layer of polysilicon formed by LPCVD deposition of polysilicon, and said third conductive layer consists of a material selected from doped polysilicon and a polycide structure.

15. A method in accordance with claim 1 wherein said angle is a selected angle between about 20 and 45 degrees.

16. A method of forming a split-gate memory cell on a semiconductor substrate of a first conductivity type, comprising the steps of:

forming a gate oxide layer on said substrate, forming a split gate structure having a first edge and a second opposing edge, said split gate structure being formed by the steps:

a) forming a first conductive gate overlying said gate oxide layer, said conductive gate comprising material, said first conductive layer comprising a heavily doped layer of polysilicon having a thickness of between about 500 Å and about 2000 Å, formed by thermal decomposition of silane $SiH_4$ in a reactor at a temperature between about 600° C. and about 650° C. at a pressure of between about 0.2 Torr and about 1.0 Torr using 100% silane or a diluted mixture of between about 20% and about 30% silane in nitrogen, b) forming an interconductor dielectric layer on said first conductive gate which comprises a bottom layer of oxide, a middle layer of nitride and a top layer of oxide, wherein said bottom layer of oxide is deposited by thermal oxidation or CVD to a thickness of between about 50 Å and about 100 Å, said nitride is deposited by a LPCVD silicon nitride deposition process to a thickness of between about 80 Å and about 180 Å and said top layer of oxide is deposited by thermal oxidation or CVD to a thickness of between about 30 Å and about 80 Å, c) forming a second conductive layer of material on said layer of dielectric material said second conductive layer comprising polysilicon having a thickness of between about 200 Å and about 2000 Å, forming the second conductive layer of said split-gate, said second conductive layer comprising a heavily doped layer of polysilicon formed by LPCVD deposition of polysilicon, forming first and second sidewall dielectric spacers adjacent to the first edge and the second opposing edge, respectively of said gate, by CVD deposition of $SiO_2$ to a thickness of between about 1000 Å and about 3000 Å followed by etching of said CVD $SiO_2$ to form said dielectric spacers, ion implanting into said substrate of a species of an opposite conductivity type, using a large angle implant of N+ dopant ions being applied using the process of Large-Angle-Implant to produce off-set Source/Drain regions in said substrate of said split-gate device, with a dopant comprising arsenic (As) with a dose of between about 1 and $8 \times 10^{15}$ $cm^{-2}$, implanted at an energy of between about 50 keV and about 100 keV in a high current LAI implanter, and forming a third conductive layer of material selected from the group consisting of polysilicon and polycide upon said second conductive layer and said first and second sidewall dielectric spacers, said third conductive material being in electrical contact with said second conductive layer.

* * * * *